(12) United States Patent
Brintzinger et al.

(10) Patent No.: US 6,638,870 B2
(45) Date of Patent: Oct. 28, 2003

(54) FORMING A STRUCTURE ON A WAFER

(75) Inventors: Axel Brintzinger, Dresden (DE); Barbara Vasquez, Munich (DE); Harry Hedler, Germering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/044,136

(22) Filed: Jan. 10, 2002

(65) Prior Publication Data
US 2003/0129841 A1 Jul. 10, 2003

(51) Int. Cl.$^7$ .............................................. H01L 21/311
(52) U.S. Cl. ...................................................... 438/694
(58) Field of Search ........................ 438/693, 694–699, 438/706, 720, 107, 112, 124

(56) References Cited

U.S. PATENT DOCUMENTS 5,734,547 A * 3/1998 Iversen ........................ 361/617
5,937,758 A * 8/1999 Maracas et al. ............. 101/327
6,147,401 A * 11/2000 Solberg ....................... 257/723
6,337,445 B1 * 1/2002 Abbott et al. ................ 174/260

* cited by examiner

Primary Examiner—Craig Thompson
(74) Attorney, Agent, or Firm—Fish & Richardson P.C.

(57) ABSTRACT

A method for fabricating a structure on an integrated circuit (IC) wafer, includes providing a material onto a surface of the wafer and shaping the material to have a shape corresponding to the structure. The method can also include removing a remaining portion of the material, depositing a seed layer onto the wafer and the material, and depositing a photoresist on the wafer. In addition, the method can include depositing a metal layer on top of the seed layer, removing the photoresist, etching the seed layer, and etching the material. The resulting structure is usable as a compression stop, a compliant element or a rerouting layer or a combination thereof.

21 Claims, 20 Drawing Sheets

FORMING A STRUCTURE ON A WAFER

TECHNICAL FIELD

This invention relates to semiconductor manufacturing processes and in particular fabricating structures on a wafer.

BACKGROUND

With wafer level packaging (WLP), semiconductor manufacturing processes test and burn-in integrated circuits (ICs) at a wafer level instead of testing and burning-in the ICs in individual form. Such wafer level test (WLT) and wafer level burn-in (WLBI) typically place the wafers on test boards. Yet, in WLP, additional features such as rerouting layers may be fabricated on top of the substrate. These rerouting layers are delicate and fragile features. A compression stop is mounted on top of the wafer and protects the interconnect elements during test, burn-in, and handling. The physical protection of the compression stop blocks or stops any further compression of compliant elements. Historically, a soft or hard passivation layer deposited on the last metal layer protected the IC during fabrication.

Compliant structures are used to reduce thermal and mechanical stresses between the wafer and the test board and to assist in providing electrical interconnects so that the ICs can be tested while in wafer form. Since compliant structures are elastic, they can be moved in up to three-dimensions. In other words, in a raised temperature environment, compliant structures decouple the stress when a wafer and a test board expand at different rates due to the different coefficients of thermal expansion between the test board and the wafer.

Typically, a method of forming a compression stop, a compliant element, and a rerouting on a wafer requires at least three photolithographic processing steps.

SUMMARY

The invention is directed to a method for fabricating structures on an integrated circuit (IC). In particular, the invention relates to forming a compression stop, a rerouting layer, and a compliant element on the surface of the wafer using one photolithographic step. The method includes providing a material onto a surface of the wafer and shaping to have a shape corresponding to the structure.

This method may also include one or more of the following embodiments. The method includes depositing the material (e.g., silicone, polyethylene, polypropylene, polyimid, epoxy, a dielectric, etc.) onto a wafer. In other embodiments, the method includes depositing a seed layer onto the wafer and the material and depositing a photoresist on the wafer. Still other embodiments include depositing a metal layer on top of the seed layer, removing the photoresist, etching the seed layer, and etching the material. In other embodiments, the structure is a compression stop, a compliant element, or a rerouting layer or a combination thereof.

In other embodiments the method includes printing the material onto the surface of the wafer. In other embodiments, the shaping of the material includes embossing the material. In other embodiments, shaping the material includes printing the material on the surface of the wafer more than once. In still other embodiments, the method includes soldering the structure to a board.

Among other advantages, the method of the invention uses only one photolithographic step to create the compression stop, compliant element and the rerouting layer. In addition, this method allows a compression stop to be mounted in any location on the wafer.

DETAILED DESCRIPTION

Figure 1:
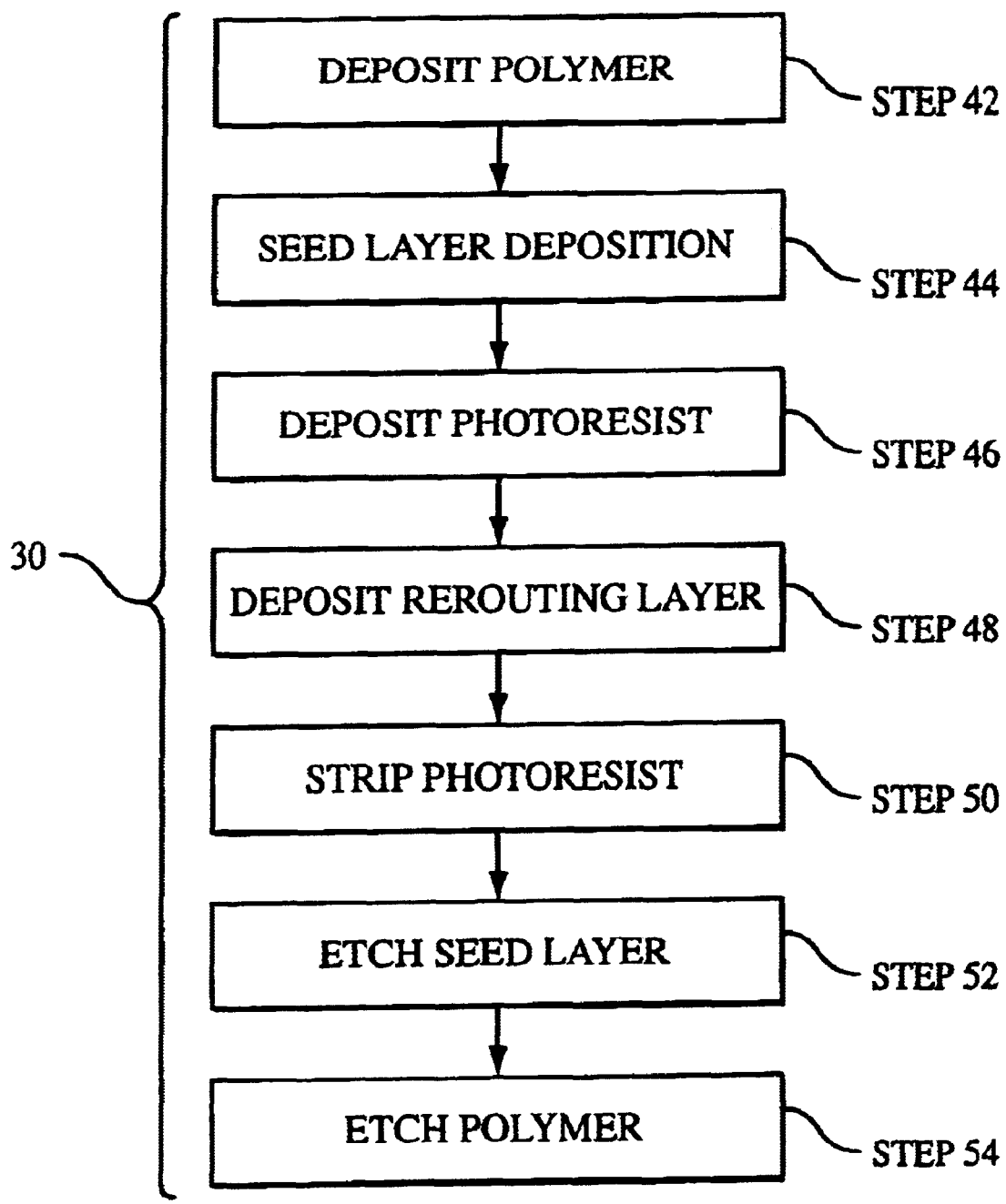
FIG. 1 is a flowchart for a process of forming a compression stop, a compliant element, and a rerouting layer.
Figure 4:
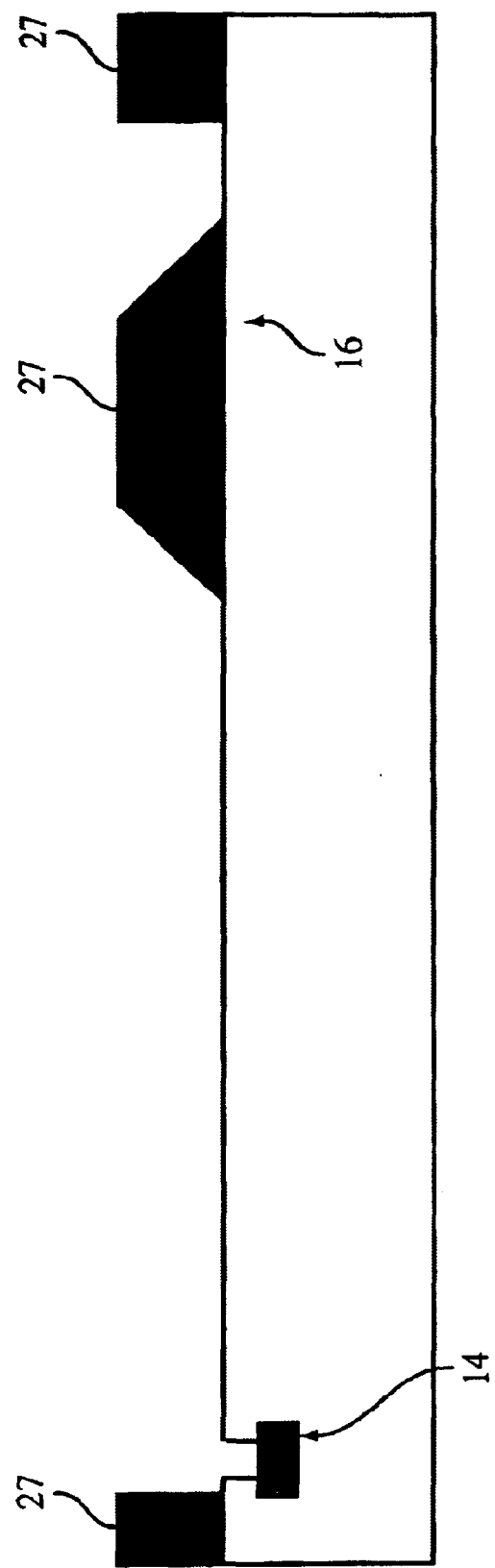
FIG. 4 is a cross-sectional diagram of the wafer after the layer of polymer is printed on a surface.

Referring to FIGS. 1 and 4, a process 30 for fabricating a structure that has a compression stop, a rerouting layer and a compliant element includes depositing a polymer 12 (e.g., silicone, polyethylene, polypropylene, polyimid, epoxy, a dielectric, etc.) on a top surface of a wafer 18 which includes a bond pad 14 (step 42). Polymer 12 has a low modulus of elasticity in order to serve as a compliant element.

Figure 2:
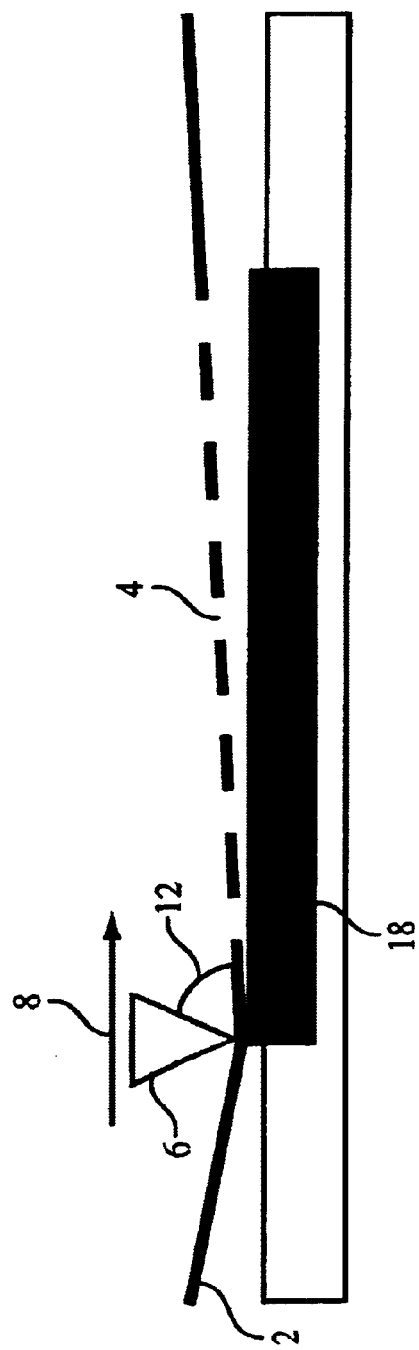
FIG. 2 is a cross-sectional view of a printing process before printing.
Figure 3:
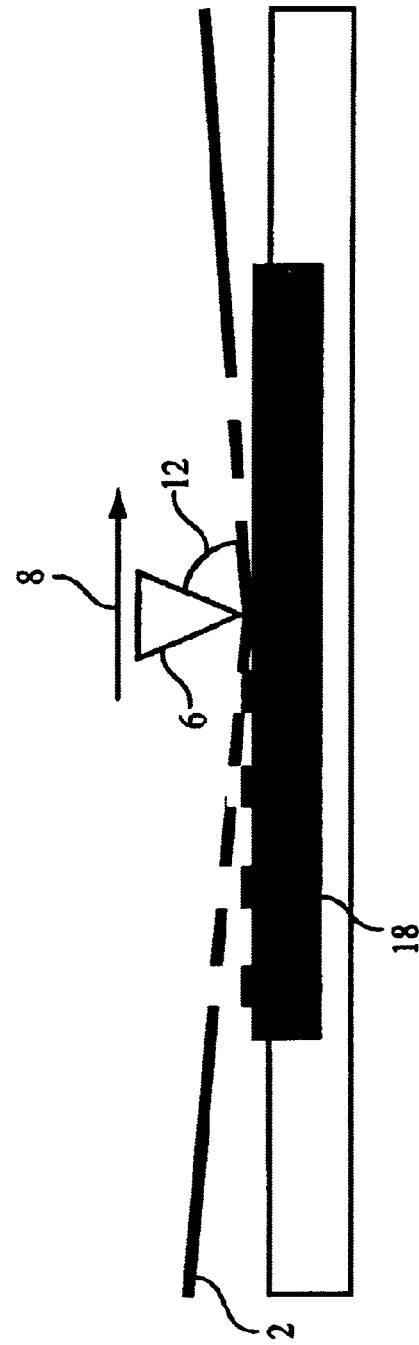
FIG. 3 is a cross-sectional view of the printing process during printing.

Referring to FIG. 2 and 3, process 30 deposits the material using a print process, called stencil printing (step 42). Polymer 12 is placed on top of a stencil 2. Stencil 2 is a stainless steel plate, for example, that has apertures 4. A squeegee 6 is used to squeeze polymer 12 through apertures 4 onto wafer 18. Squeegee 6 is moved in a direction 8 across stencil 2.

Referring to FIG. 4, typically, the stencil print process takes five passes to create shapes 27. After each pass, polymer 12 is immediately cured, otherwise polymer 12 would have a low viscosity.

Figure 5:
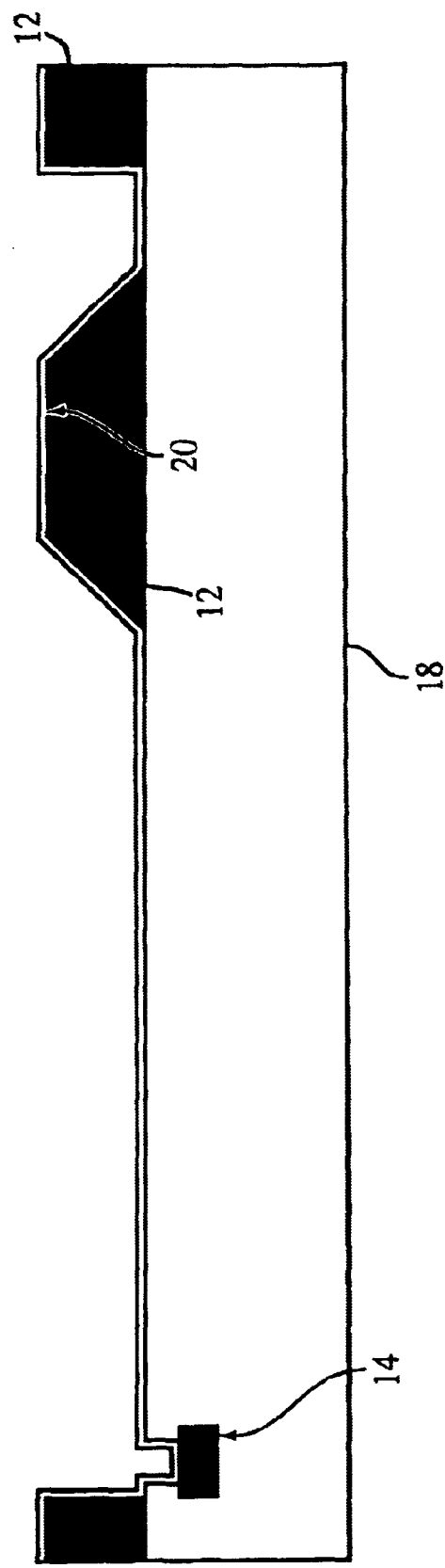
FIG. 5 is a cross-sectional diagram of the wafer after deposition of a seed layer.

Referring to FIGS. 1 and 5, process 30 includes depositing (e.g., sputtering, etc.) a seed layer 20 (e.g., chromium, titanium, gold, copper) onto the surface of the wafer and the polymer 12 (step 44). The seed layer 20 aids in the subsequent metallization steps by providing an adhesive surface for subsequently deposited metal layers.

Figure 6:
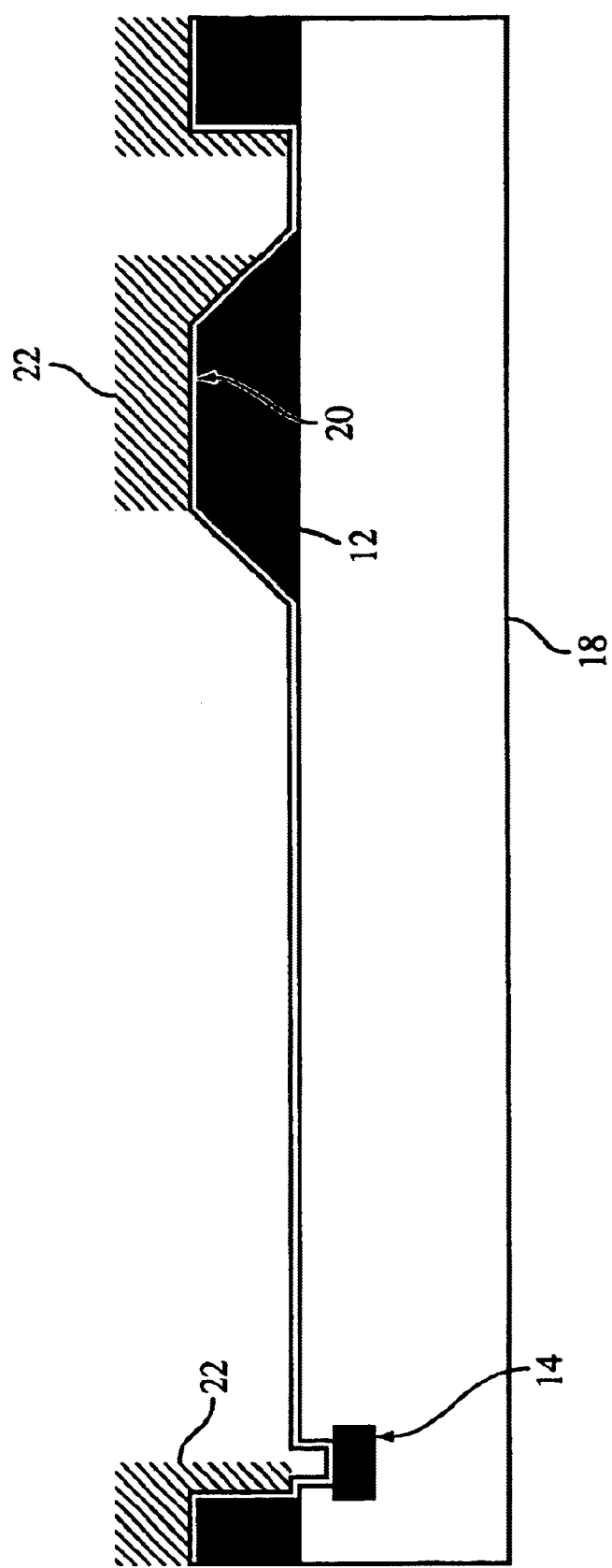
FIG. 6 is a cross-sectional diagram of the wafer after deposition of a photoresist.

Process 30 also includes a photolithographic step in which a photoresist layer 22, a negative photoresist, is applied onto the polymer 12 (step 46). The photolithographic step also includes placing a mask onto the wafer 18 and exposing the wafer to light, such as ultraviolet light (UV) (step 46). A portion of the photoresist layer 22 over areas where the metal layer is to be deposited reacts to the light and become depolymerized (step 46). The depolymerized photoresist is easily removed in a developing solution (step 50), the result of which is shown in FIG. 6. In other embodiments, the photoresist is removed by chemical etch (e.g., wet, dry). In other embodiments, the photolithographic step uses a positive photoresist in place of the negative photoresist.

Figure 7:
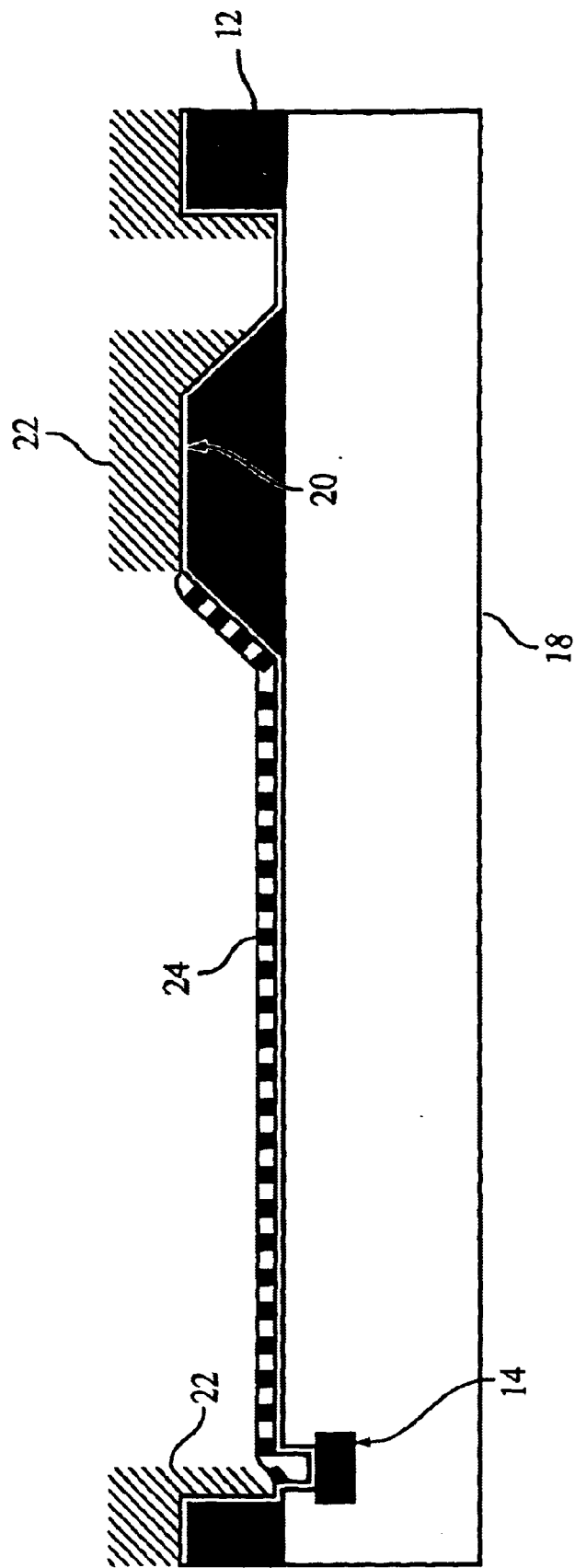
FIG. 7 is a cross-sectional diagram of the wafer after deposition of a metal layer.

Referring again to FIG. 1, process 30 includes a deposition (e.g., sputtering) of a metal layer 24 (e.g., gold, copper) onto the wafer 18 including the seed layer 20 (step 48) as shown in FIG. 7.

Figure 8:
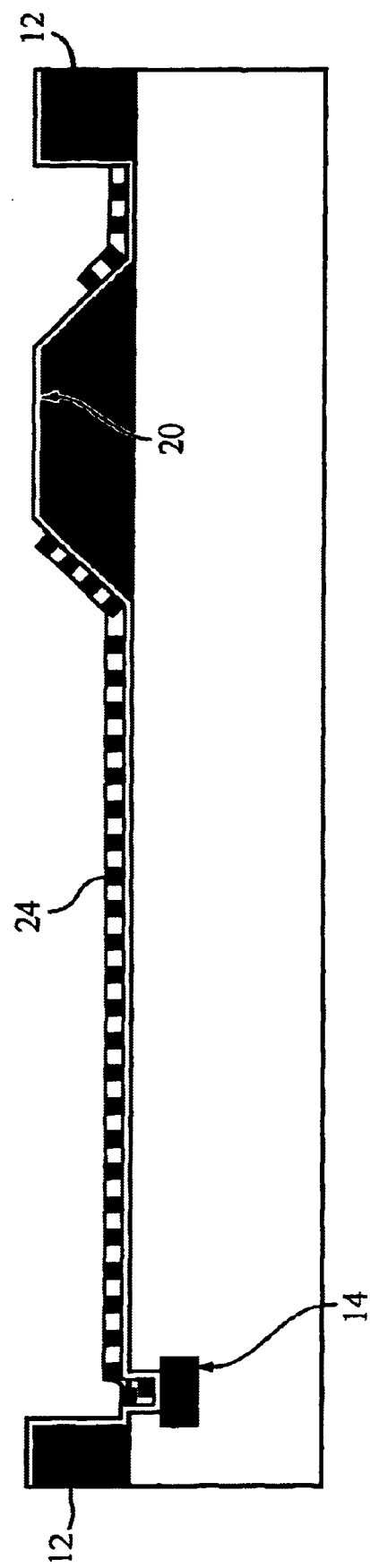
FIG. 8 is a cross-sectional diagram of the wafer after removal of the photoresist.

Referring to FIGS. 1 and 8, process 30 also includes removing the remaining photoresist layer 22 by exposing the photoresist to light such as UV (step 50). In other embodiments, the photoresist is chemically etched (e.g., wet, dry).

Figure 9:
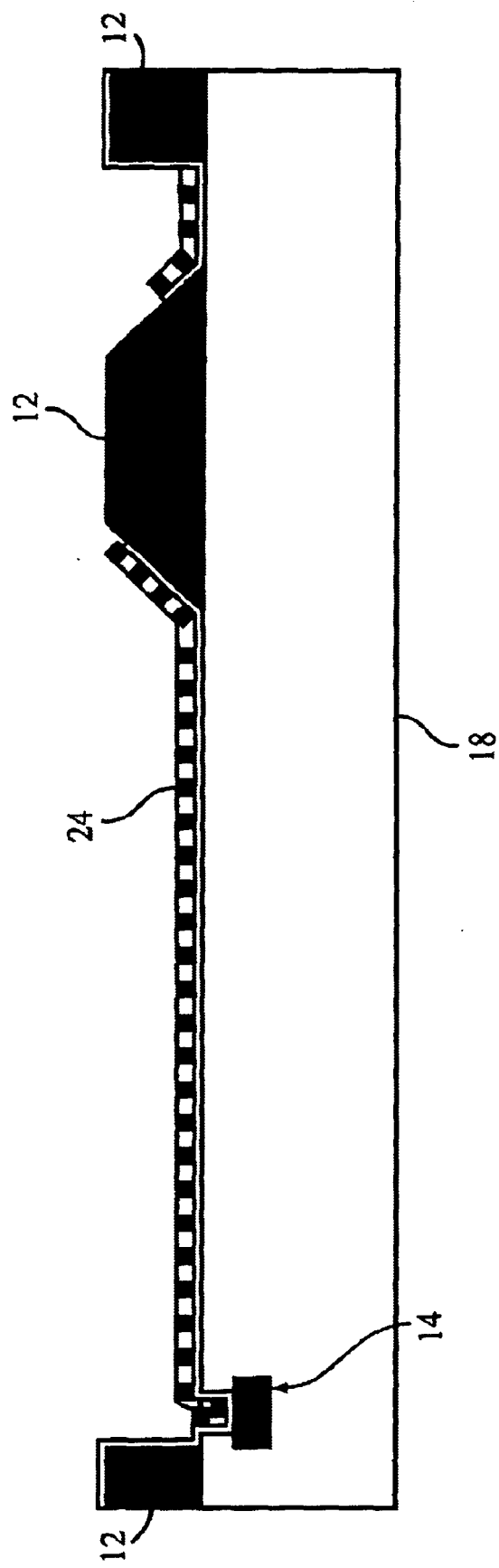
FIG. 9 is a cross-sectional diagram of the wafer after removal of part of the seed layer.
Figure 10:
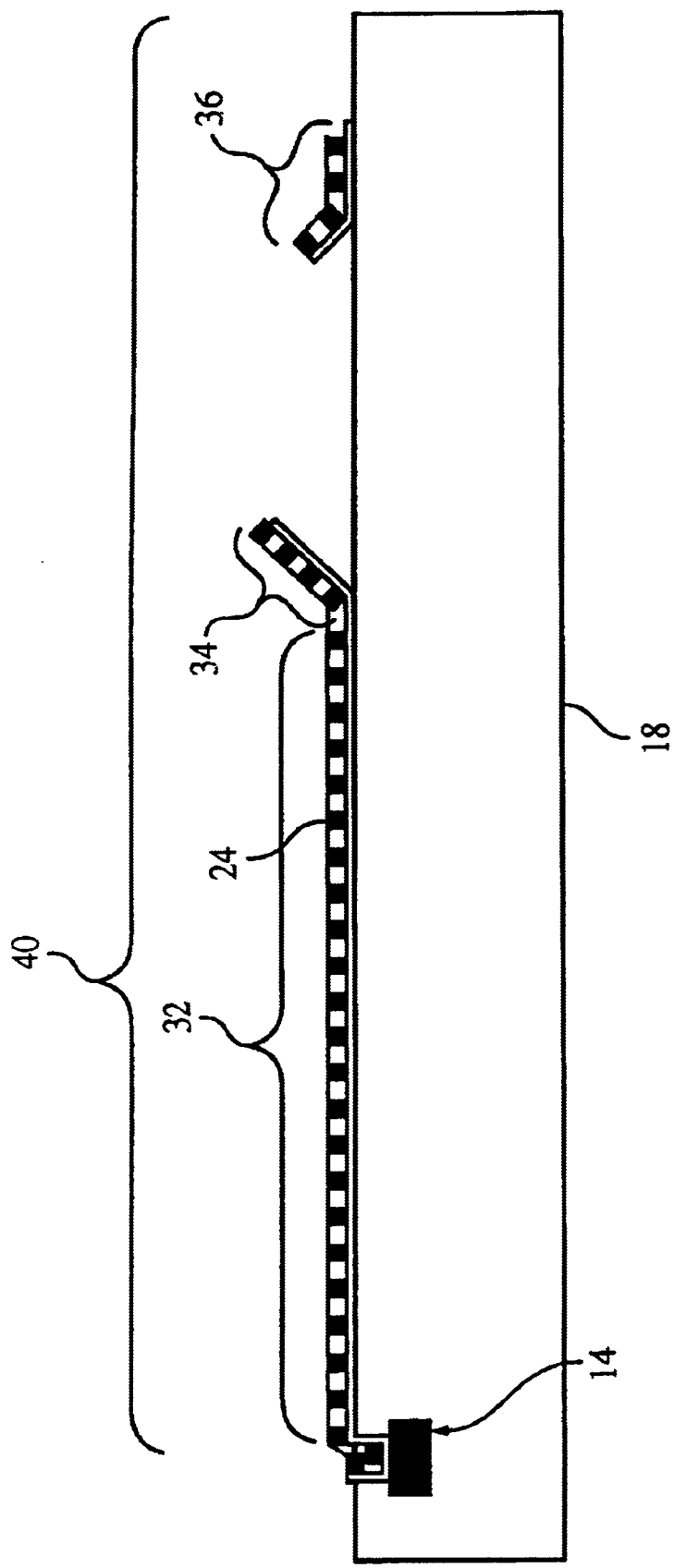
FIG. 10 is a cross-sectional diagram of a structure on the wafer after removal of the polymer.

Referring to FIGS. 1 and 9, process 30 further includes removing, through an etching process (step 52), excess portions of the seed layer 20 that were under the photoresist layer 22. Referring to FIGS. 1 and 10, process 30 includes etching away (e.g., chemical etching) the remaining portions of the polymer 12 so that a structure 40 remains (step 54). The structure 40 includes a compression stop 36, a compliant element 34, and a rerouting layer 32.

Process 30 thus forms the structure in only one photolithographic step, thereby eliminating at least two additional photolithographic steps needed to create the compression stop, the compliant element, and the metal layer. Moreover, the printing process technique of the invention enables the structure to be formed anywhere on the wafer.

Figure 11:
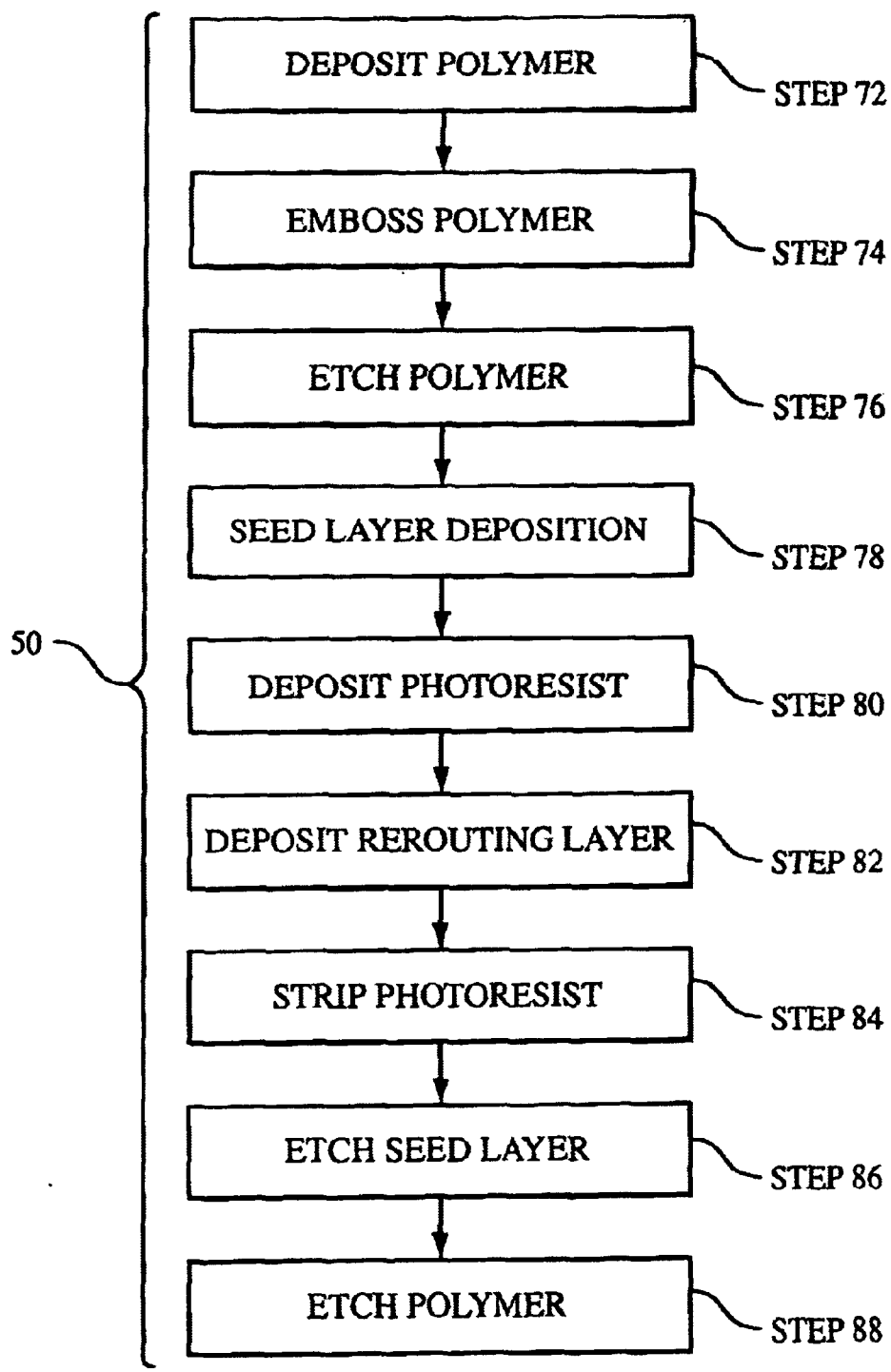
FIG. 11 is a flow chart is another embodiment showing a process of forming a compression stop, a compliant element, and a rerouting layer using embossing.
Figure 12:
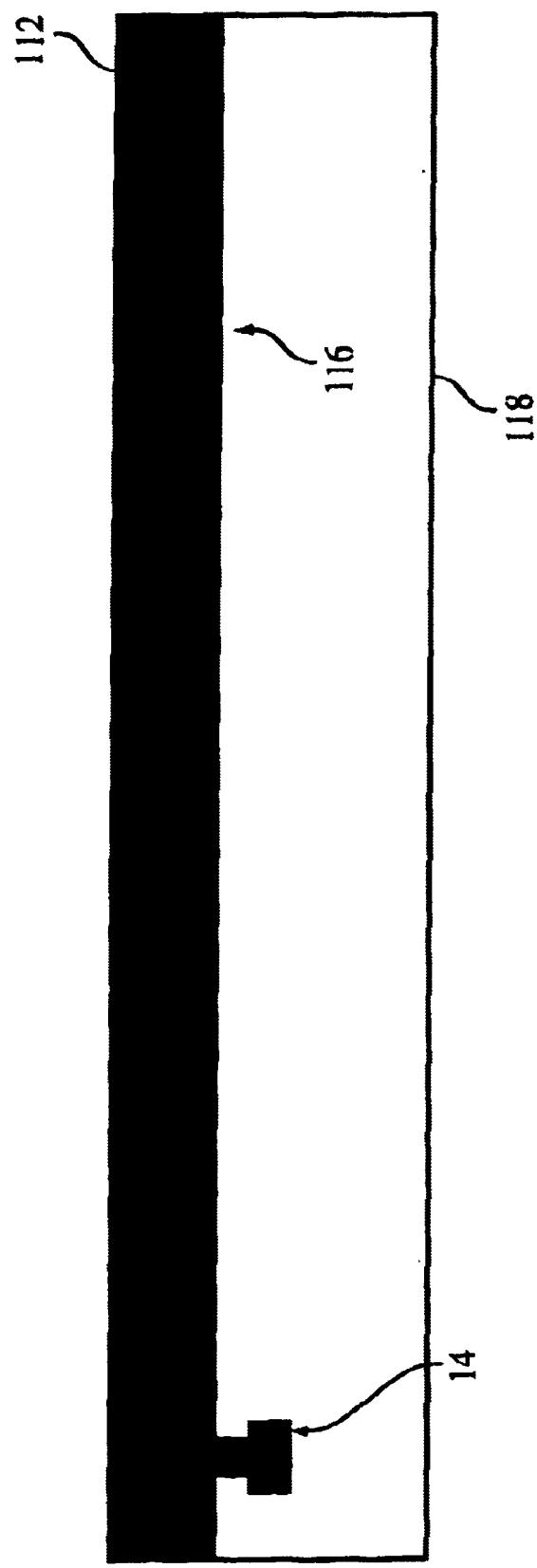
FIG. 12 is a cross-sectional diagram of a wafer with a layer of polymer.
Figure 13:
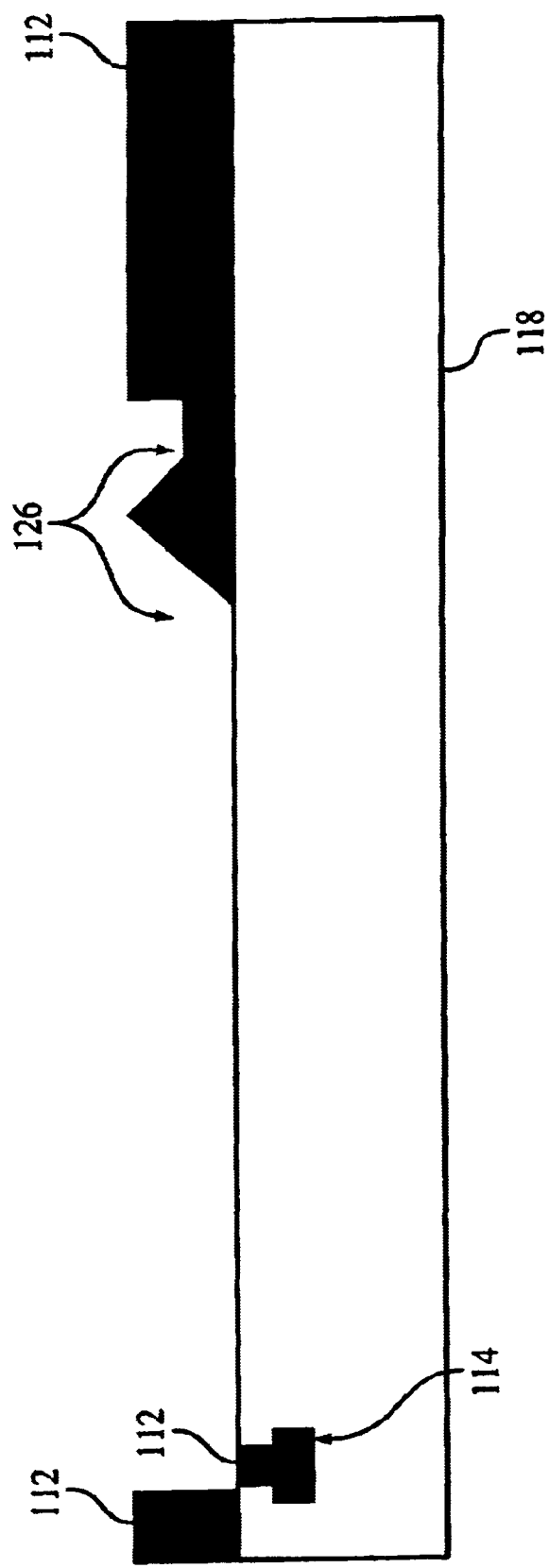
FIG. 13 is a cross-sectional diagram of the wafer after the layer of polymer is embossed.

Referring to FIGS. 11 and 12, in other embodiments, the structure is created using an embossing technique rather than a printing technique. Process 50 includes embossing a transparent polymer 112 with an embossing tool (step 74), the result of which is shown in FIG. 13. The embossing tool is made of a rigid material (e.g., metal, ceramic) shaped to have a negative shape of the desired structure. The embossing tool is positioned over the wafer by aligning the embossing tool to a set of structures or alignment marks observed through the transparent polymer material 112. Pressure is applied on the embossing tool to impress its negative shape into the polymer 112. When the tool is withdrawn, it leaves an indentation 126 on the polymer 112 that forms a shape of the structure as shown in FIG. 13. The pressure applied to the embossing tool is enough to press the embossing tool only as far as the surface of the wafer 118. Therefore, not all the polymer 112 is displaced when the wafer 118 is embossed because some of the polymer over the bond pad 114 is underneath the surface of the wafer.

Figure 14:
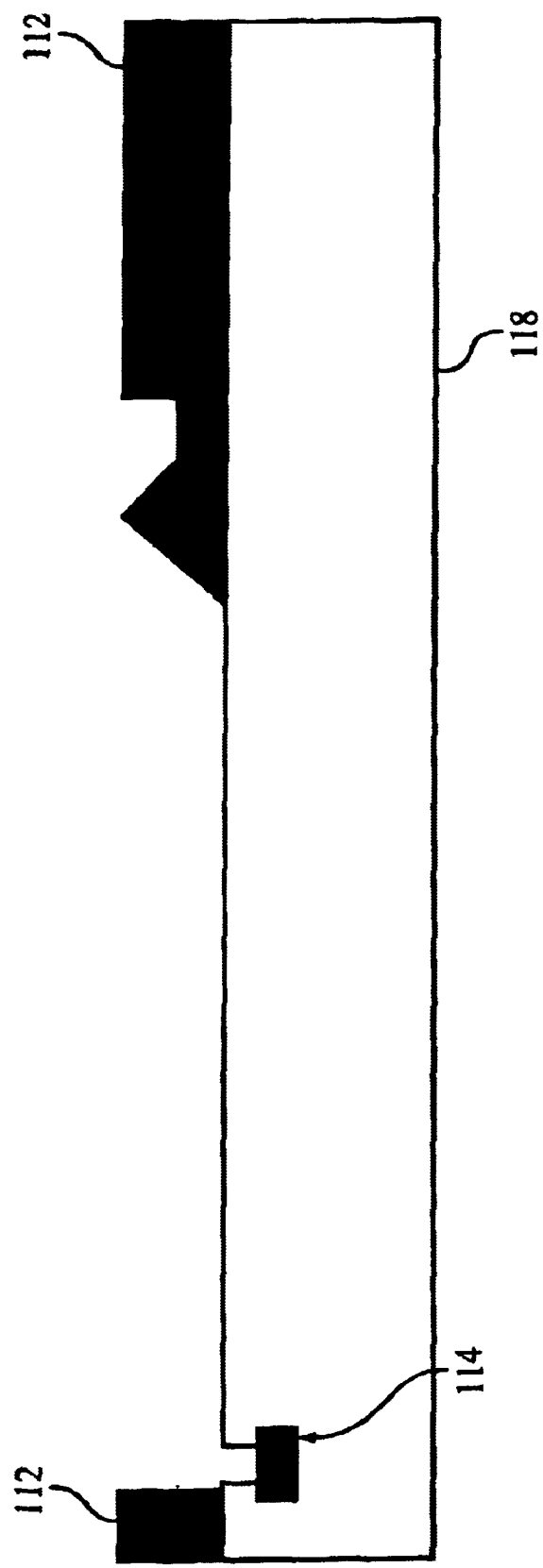
FIG. 14 is a cross-sectional diagram of the wafer after the removal of the excess polymer over a bond pad.

Referring back to FIG. 11, process 50 includes removal of the excess polymer 12 (step 76) over the bond pad 114 by an etching process (e.g., dry chemical etch), the result of which is shown in FIG. 14.

Figure 15:
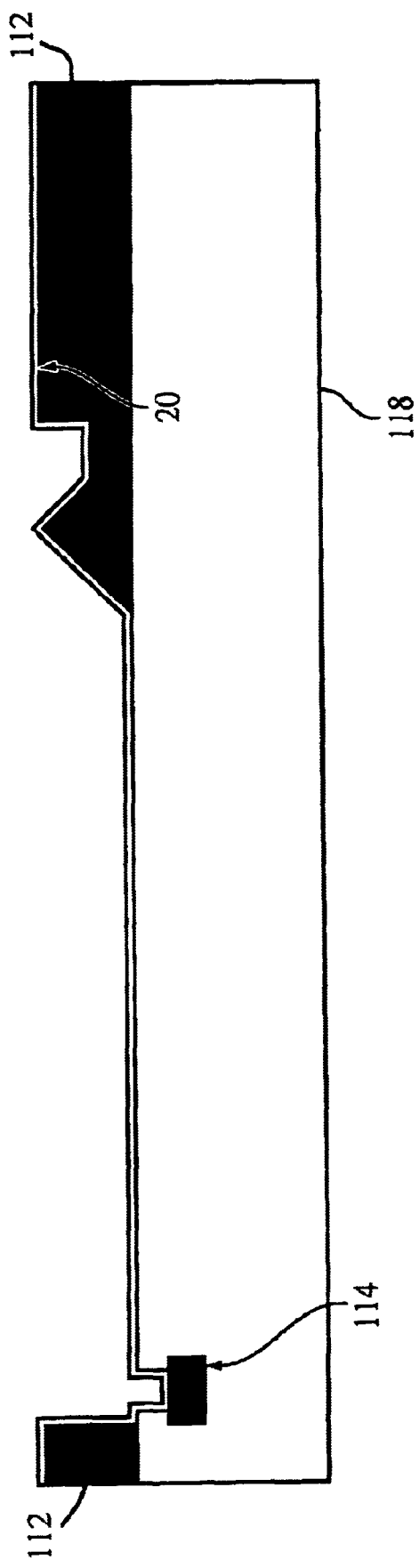
FIG. 15 is a cross-sectional diagram of the wafer after deposition of a seed layer.

Referring to FIGS. 11 and 15, process 50 includes depositing (e.g., sputtering, etc.) a seed layer 120 (e.g., chromium, titanium, gold, copper) onto the surface of the wafer and the polymer 112 (step 78).

Figure 16:
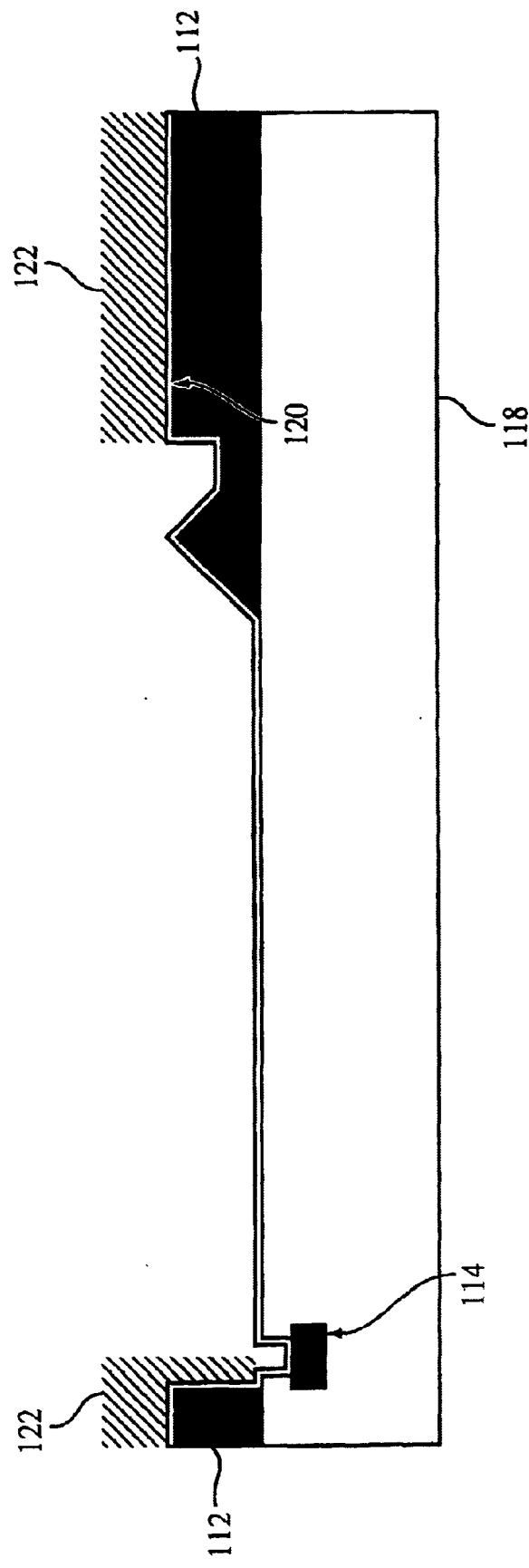
FIG. 16 is a cross-sectional diagram of the wafer after deposition of a photoresist.

Process 50 also includes a photolithographic step in which a photoresist layer 122, a negative photoresist, is applied onto the polymer 112 (step 80). The photolithographic step also includes placing a mask onto the wafer 118 and exposing the wafer to light, such as UV light (step 60). A portion of the photoresist layer 122 over areas where the metal layer is to be deposited reacts to the light and become depolymerized (step 80). The depolymerized photoresist is easily removed in a developing solution (step 80), the result of which is shown in FIG. 16. In other embodiments, the photolithographic step uses a positive photoresist in place of the negative photoresist.

Figure 17:
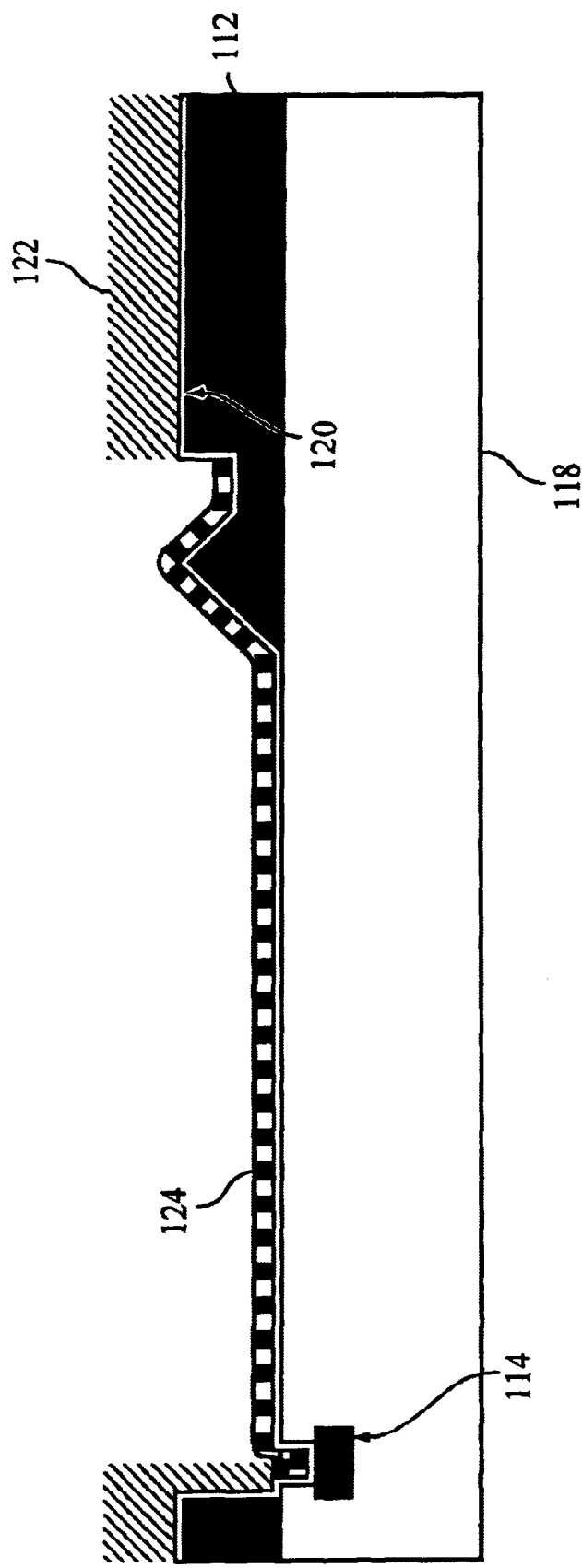
FIG. 17 is a cross-sectional diagram of the wafer after deposition of a metal layer.

Referring again to FIG. 11, process 50 includes a deposition (e.g., sputtering) of a metal layer 124 (e.g., gold, copper) onto the wafer 18 including the seed layer 120 (step 82) as shown in FIG. 17.

Figure 18:
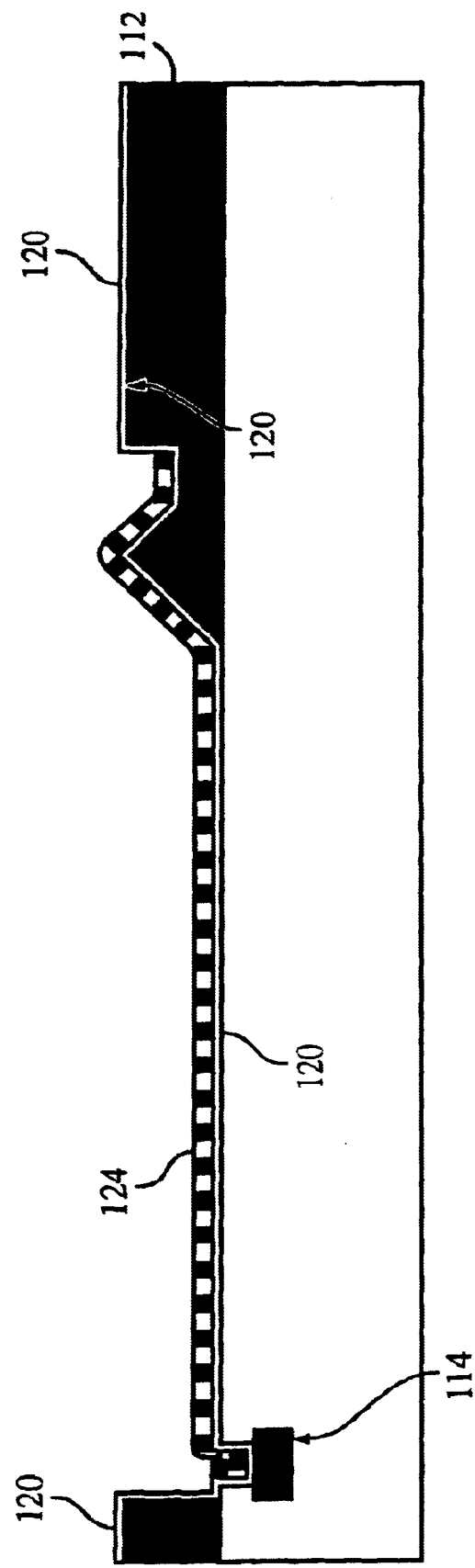
FIG. 18 is a cross-sectional diagram of the wafer after removal of the photoresist.

Referring to FIGS. 11 and 18, process 50 also includes removing the remaining photoresist layer 122 by exposing the photoresist to light such as UV (step 84).

Figure 19:
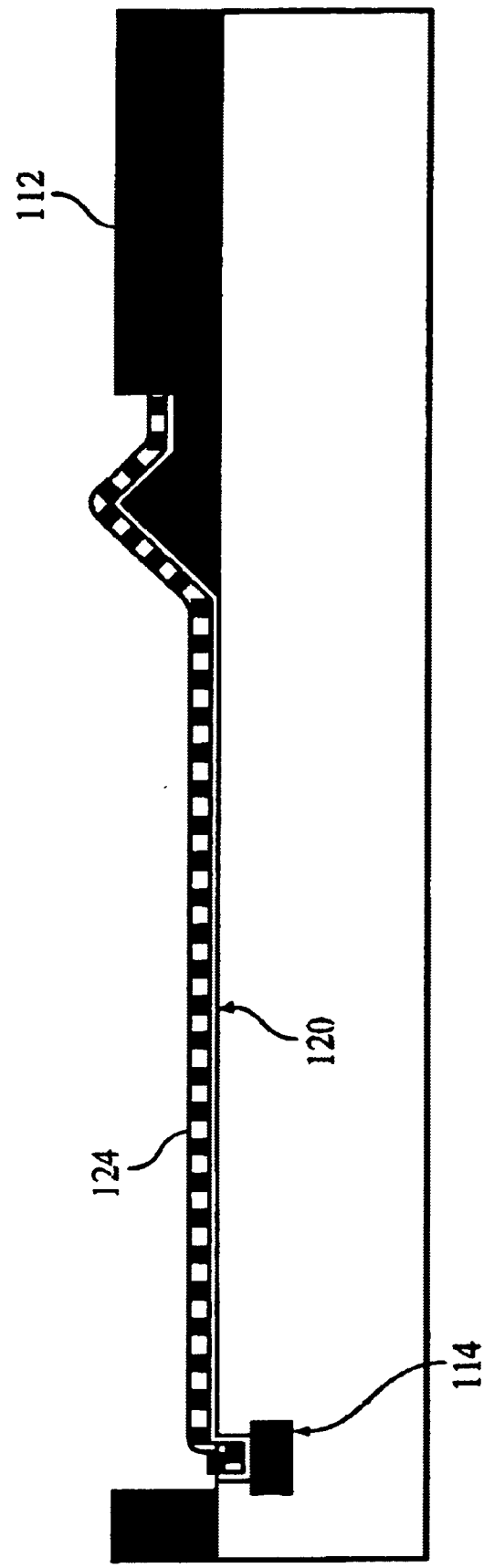
FIG. 19 is a cross-sectional diagram of the wafer after removal of part of the seed layer.
Figure 20:
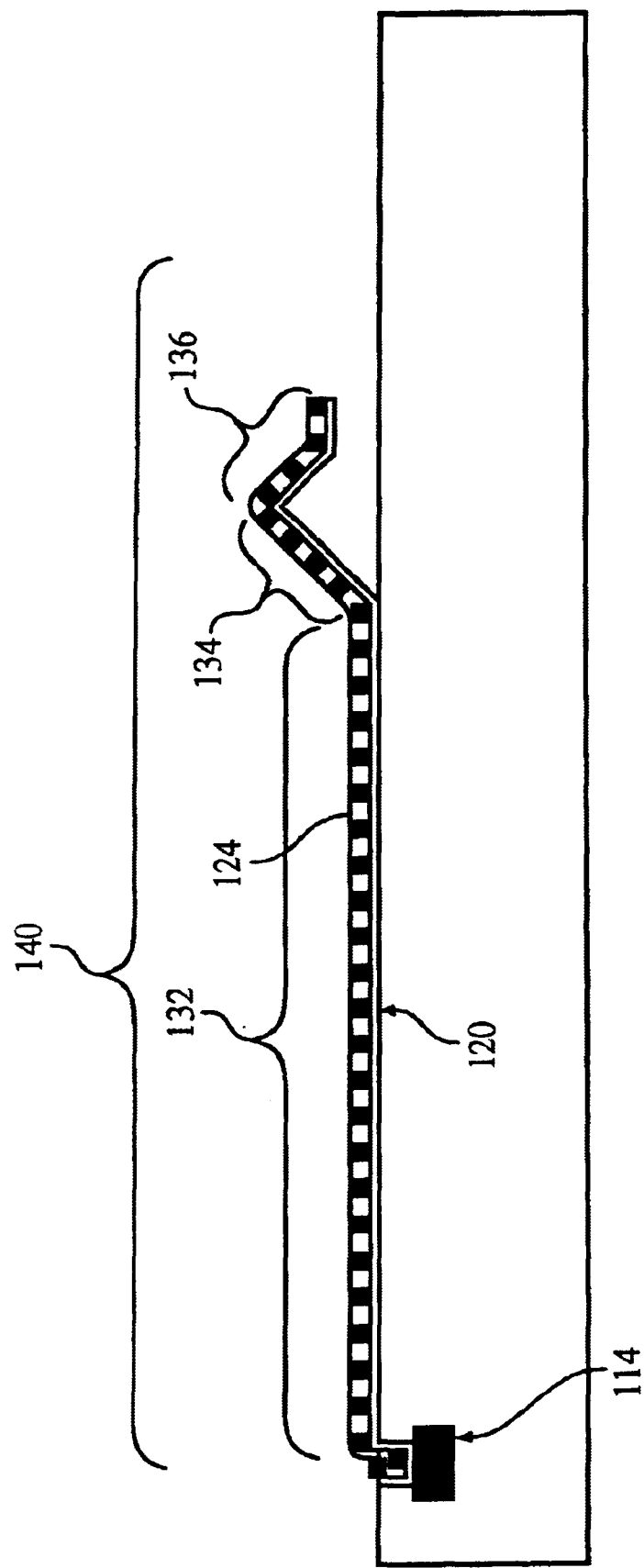
FIG. 20 is a cross-sectional diagram of a structure on the wafer after removal of the polymer.

Referring to FIGS. 11 and 19, process 50 further includes removing excess portions of the seed layer 120 that were under the photoresist layer 122 through an etching process (step 86). Referring to FIGS. 11 and 20, process 50 includes etching away (e.g., chemical etching) the remaining portions of the polymer 112 so that a structure 140 remains (step 88). The structure 140 includes a compression stop 136, a compliant element 134, and a rerouting layer 132. In other embodiments, laser ablation and molding techniques can be used to create the structure.

Figure 21:
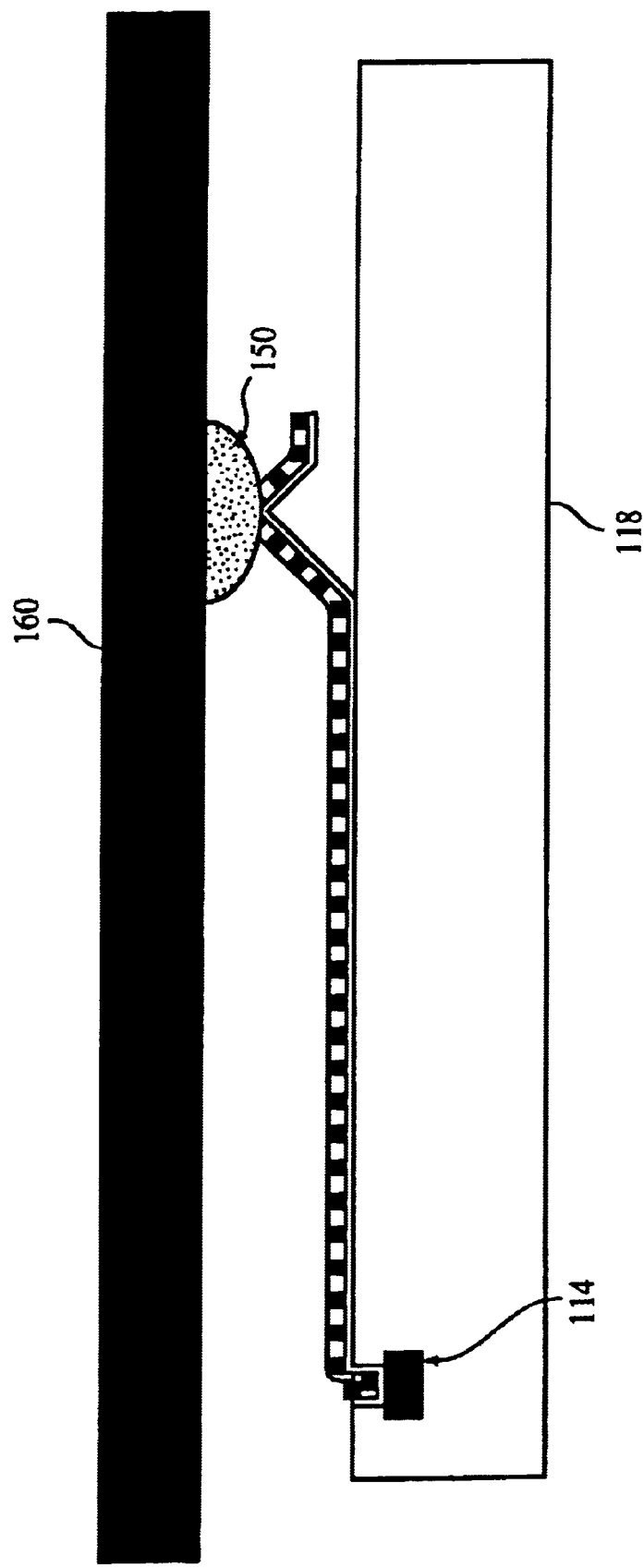
FIG. 21 is a cross-sectional diagram of the structure on a wafer in FIG. 20 with the wafer soldered to a board.

Referring to FIG. 21, in still other embodiments, wafer 118 is bonded to a board 160 with a solderball 150. This process can be done using conventional soldering techniques.

Other embodiments not described here are also within the scope of the following claims.

What is claimed is:

1. A method for fabricating a structure on an integrated circuit (IC) wafer, comprising:

printing a material onto a surface of the wafer; and shaping the material to have a shape corresponding to the structure, the structure having a combination of at least two elements from the group consisting of a compression stop, a compliant element, and a rerouting layer.

2. The method of claim 1, further comprising removing an excess portion of the material.

3. The method of claim 2, further comprising:

depositing a seed layer onto the material; and depositing a photoresist onto the wafer.

4. The method of claim 3, further comprising depositing a metal layer on top of the seed layer.

5. The method of claim 4, further comprising removing the photoresist.

6. The method of claim 5, further comprising etching the seed layer.

7. The method of claim 6, further comprising etching the material.

8. The method of claim 1, wherein providing the material comprises selecting a polymer as the material.

9. The method of claim 8, wherein selecting the polymer comprises using polymethyl methacrylate (PMMA) as the polymer.

10. The method of claim 1 wherein shaping the material comprises printing the material on the surface of the wafer more than once.

11. The method of claim 1, further comprising soldering the structure to a board.

12. A method for fabricating a structure on an integrated circuit (IC) wafer, comprising:

providing a material onto a surface of the wafer; and embossing the material to have a shape corresponding to the structure, the structure having a combination of at least two elements from a group of elements comprising a compression stop, a compliant element, and a rerouting layer.

13. The method of claim 12, further comprising removing an excess portion of the material. material.

14. The method of claim 12, further comprising:

depositing a seed layer onto the material; and depositing a photoresist onto the wafer.

15. The method of claim 14, further comprising depositing a metal layer on top of the seed layer.

16. The method of claim 14, further comprising removing the photoresist.

17. The method of claim 14, further comprising etching the seed layer.

18. The method of claim 12, further comprising etching the material.

19. The method of claim 1, wherein providing the material comprises selecting a, polymer as the material.

20. The method of claim 19, wherein selecting the polymer comprises using polymethyl methacrylate (PMMA) as the polymer.

21. The method of claim 12, further comprising soldering the structure to a board.

* * * * *